United States Patent
Okamoto et al.

(10) Patent No.: US 10,325,716 B2
(45) Date of Patent: Jun. 18, 2019

(54) ELECTRIC EQUIPMENT

(71) Applicant: HONDA MOTOR CO., LTD., Minato-ku, Tokyo (JP)

(72) Inventors: Noriaki Okamoto, Wako (JP); Masahiro Shimada, Wako (JP); Naoto Kochi, Wako (JP); Satoshi Hashino, Wako (JP); Satoru Fujita, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/992,341

(22) Filed: May 30, 2018

(65) Prior Publication Data

US 2018/0350515 A1    Dec. 6, 2018

(30) Foreign Application Priority Data

May 31, 2017    (JP) .................. 2017-108842

(51) Int. Cl.
| | | |
|---|---|---|
| G01R 15/20 | (2006.01) |
| H01F 27/40 | (2006.01) |
| H01F 27/34 | (2006.01) |
| H01F 27/28 | (2006.01) |
| H01F 3/14 | (2006.01) |
| G01R 19/15 | (2006.01) |
| H01F 27/29 | (2006.01) |

(52) U.S. Cl.
CPC ......... *H01F 27/402* (2013.01); *G01R 15/202* (2013.01); *G01R 15/207* (2013.01); *G01R 19/15* (2013.01); *H01F 3/14* (2013.01); *H01F 27/2823* (2013.01); *H01F 27/29* (2013.01); *H01F 27/346* (2013.01)

(58) Field of Classification Search
CPC .... G01R 15/202; G01R 15/207; G01R 19/15; G01R 19/2513; H01F 3/14; H01F 27/29; H01F 27/346; H01F 27/402; H01F 27/2823; H02M 3/15; H02M 3/158; H02M 3/1584; H02M 3/1582
See application file for complete search history.

(56) References Cited

U.S. PATENT DOCUMENTS

| 8,750,008 B2 * | 6/2014 | Sugiyama | H02M 1/15 363/131 |
| 9,647,544 B2 * | 5/2017 | Ishigaki | H01F 27/38 |

FOREIGN PATENT DOCUMENTS

| JP | 2003-121478 | 4/2003 |
| JP | 2010-197155 | 9/2010 |
| JP | 2012-105369 | 5/2012 |
| JP | 2013-149785 | 8/2013 |
| JP | 2016-066720 | 4/2016 |
| JP | 2016-066744 | 4/2016 |
| JP | 2017-204981 | 11/2017 |

* cited by examiner

*Primary Examiner* — Minh N Tang
(74) *Attorney, Agent, or Firm* — Amin, Turocy & Watson LLP

(57) ABSTRACT

In electric equipment, a switching substrate is provided along winding axes of winding parts. A part of the switching substrate is overlapped with a reactor, as viewed in a direction perpendicular to a virtual plane including the winding axes. Further, an electric current sensor is shifted from the reactor in a direction of winding axes, and a sensor substrate is provided in parallel to the virtual plane.

6 Claims, 10 Drawing Sheets

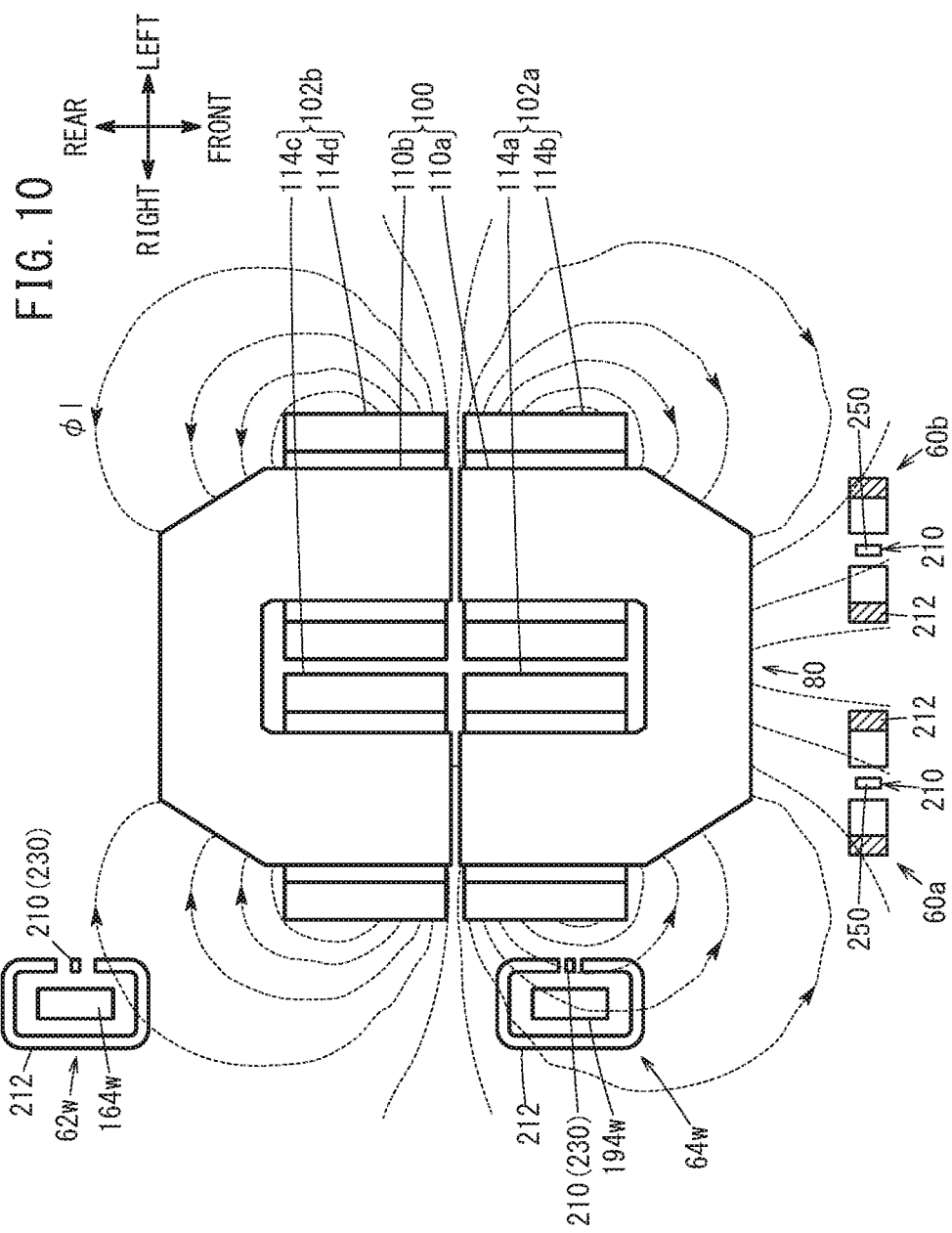

ELECTRIC EQUIPMENT

CROSS-REFERENCE TO RELATED APPLICATION

This application is based upon and claims the benefit of priority from Japanese Patent Application No. 2017-108842 filed on May 31, 2017, the contents of which are incorporated herein by reference.

BACKGROUND OF THE INVENTION

Field of the Invention

The present invention relates to electric equipment including an electric current sensor.

Description of the Related Art

Japanese Laid-Open Patent Publication No. 2010-197155 discloses a magnetic flux detection device 100 using a Hall element 10 (FIG. 1, paragraph [0027]). The Hall element 10 at least includes a reference terminal tb, a power supply terminal td, and an output terminal "to" (paragraph [0024]). The reference terminal tb is used for setting a reference potential. Power supply voltage is applied to the power supply terminal td in a manner that magnetic flux Φ can be detected. The output terminal "to" outputs an output signal in correspondence with the detected magnetic flux Φ (paragraph [0024]). Further, the Hall element 10 includes a non-connection terminal tn, e.g., used for output noise adjustment (paragraph [0025]).

The terminals tb, td, to, tn are connected to lands 51a to 51d provided on a substrate 50, respectively (FIG. 2, FIG. 3, paragraph [0025]). Among them, the lands 51a, 51b, 51d are connected to connection terminals 52a to 52c, and connected to the outside, respectively (paragraph [0026]).

Japanese Laid-Open Patent Publication No. 2016-066744 discloses a compound type reactor (or magnetic coupling type reactor) used in a DC/DC converter, etc.

SUMMARY OF THE INVENTION

As described above, the reference terminal tb, the power supply terminal td, and the output terminal to of Japanese Laid-Open Patent Publication No. 2010-197155 are connected to the outside through lands 51a, 51b, 51d and the connection terminals 52a to 52c of the substrate 50 (FIGS. 2 and 3 and paragraphs [0025], [0026]). However, in Japanese Laid-Open Patent Publication No. 2010-197155, there is no consideration about the layout of the substrate 50 in relation to the magnetic field generation source such as the magnetic coupling type reactor of Japanese Laid-Open Patent Publication No. 2016-066744. Also in Japanese Laid-Open Patent Publication No. 2016-066744, there is no consideration in this regard.

Further, in Japanese Laid-Open Patent Publication No. 2010-197155 and Japanese Laid-Open Patent Publication No. 2016-066744, the layout (or freedom in the design) about components such as the reactor and the Hall element has not been studied in consideration of the size of electric equipment as a whole.

The problem of this type is not limited to the case of the Hall element 10, and is present as well also in the outputs from other detection elements.

The present invention has been made taking the above problem into account, and an object of the present invention is to provide electric equipment which makes it possible to improve the freedom of design in the electric equipment as a whole, and suppress detection errors in the output signals outputted from the electric current sensors.

Electric equipment according to the present invention includes a reactor including a pair of winding parts including winding axes on a same virtual plane, a bus bar electrically connecting the winding parts and a switching element, a switching substrate supporting the switching element, and an electric current sensor configured to detect electric current flowing the bus bar. The electric current sensor includes a detection element, an annular core having a gap for providing the detection element, and a sensor substrate connecting the detection element and a wiring line, and configured to output a signal indicative of an electric current value. The switching substrate is provided along the winding axes, and a part of the switching substrate is overlapped with the reactor, as viewed in a direction perpendicular to the virtual plane. The electric current sensor is shifted from the reactor in a direction of the winding axes, and the sensor substrate is provided in parallel to the virtual plane. The bus bar includes a first plate part and a second plate part. At least a part of the first plate part is overlapped with the switching substrate as viewed in a direction perpendicular to the virtual plane, and the first plate part extends in parallel to the virtual plane, and the second plate part extends from the first plate part toward the switching substrate, as viewed in a direction parallel to the virtual plane.

In the present invention, the switching substrate is provided along the winding axes of the winding parts and a part of the switching substrate is overlapped with the reactor, as viewed in a direction perpendicular to the virtual plane including the respective winding axes of the pair of winding parts. In the structure, it becomes possible to achieve size reduction of the electric equipment in the direction of the winding axes.

Further, in the present invention, the electric current sensors are shifted from the reactor in the direction of the winding axes, and the sensor substrate is provided in parallel to the virtual plane. Therefore, it becomes possible to suppress interlinkage of the AC magnetic field generated from the reactor with the sensor substrate, and suppress detection errors of the electric current sensors.

The detection element may be provided between the first plate part and the sensor substrate, as viewed in the direction parallel to the virtual surface. In the structure, in the state where the distance between the sensor substrate and the first plate part is kept long relatively, by providing the detection element close to the first plate part, it becomes possible to improve the detection sensitivity of the detection element.

The second plate part may be provided between the switching substrate and the sensor substrate, as viewed in the direction parallel to the virtual plane.

The detection element may be overlapped with the reactor, as viewed in the direction of the winding axes. Further, a magnetic field detection surface of the detection element may be oriented in a direction perpendicular to the direction of the winding axes. In the structure, it becomes possible to suppress interlinkage of the AC magnetic field generated from the reactor with the detection element, and suppress detection errors of the electric current sensor.

The first plate part may be overlapped with the reactor, as viewed in the direction of the winding axes. In this manner, the sensor substrate supporting the detection element configured to detect the electric current of the first plate part is also provided at the position overlapped with the reactor or close to the reactor, as viewed in the direction of the winding axes. Therefore, it becomes possible to suppress interlinkage of the AC magnetic field generated from the reactor with the sensor substrate, and suppress detection errors of the electric current sensor to a greater extent.

The bus bar may include a third plate part electrically connected to the second plate part, and a fourth plate part electrically connecting the third plate part and the switching substrate. Further, the third plate part and the fourth plate part may be provided between the switching substrate and the first plate part, as viewed in the direction of the winding axes, and the third plate part and the fourth plate part may be provided between the reactor and the second plate part in the direction of the winding axes, as viewed in the direction perpendicular to the virtual plane. The third plate part may be in parallel to the first plate part and the switching substrate, and the fourth plate part may be in parallel to the second plate part.

In the above structure, the second plate part and the third plate part are positioned remotely from the reactor in comparison with the fourth plate part, in the direction of the winding axes. Stated otherwise, by combining the first plate part, the second plate part, the third plate part, and the fourth plate part, it becomes possible to provide the sensor substrate oriented in the direction of the coil axes at a position shifted from the reactor in the direction of the coil axes. Therefore, it becomes possible to suitably suppress interlinkage of the AC magnetic field generated from the reactor with the sensor substrate.

The reactor may include a first coupling coil including a first winding part and a second winding part, and a second coupling coil including a third winding part and a fourth winding part. The winding axis of the first winding part may be in alignment with the winding axis of the third winding part, and the winding axis of the second winding part may be in alignment with the winding axis of the fourth winding part. The electric equipment may include a first bus bar and a second bus bar as a plurality of the bus bars, and a first electric current sensor as the electric current sensor configured to detect electric current flowing the first plate part of the first bus bar, and a second electric current sensor as the electric current sensor configured to detect electric current flowing the first plate part of the second bus bar. The sensor substrate may be a common sensor substrate used in common by the first electric current sensor and the second electric current sensor.

In this manner, even in the case where the reactor is a magnetic coupling type reactor, and the first bus bar and the second bus bar are present, it becomes possible to suppress interlinkage of the AC magnetic field generated from the reactor with the sensor substrate, and suppress detection errors of the electric current sensors. Further, by providing the common sensor substrate, in comparison with the case of providing separate sensor substrates, it becomes possible to reduce the number of component parts, and it becomes easy to position the sensor substrate.

In the present invention, it becomes possible to improve the freedom of design in the electric equipment as a whole, and suppress detection errors in the output signals outputted from the electric current sensors.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 10 is a plan view showing an example of magnetic field (leakage magnetic flux) generated by the reactor according to the embodiment.

DESCRIPTION OF THE PREFERRED EMBODIMENTS

A. Embodiment

A-1. Structure

[A-1-1. Overall Structure]

Figure 1:
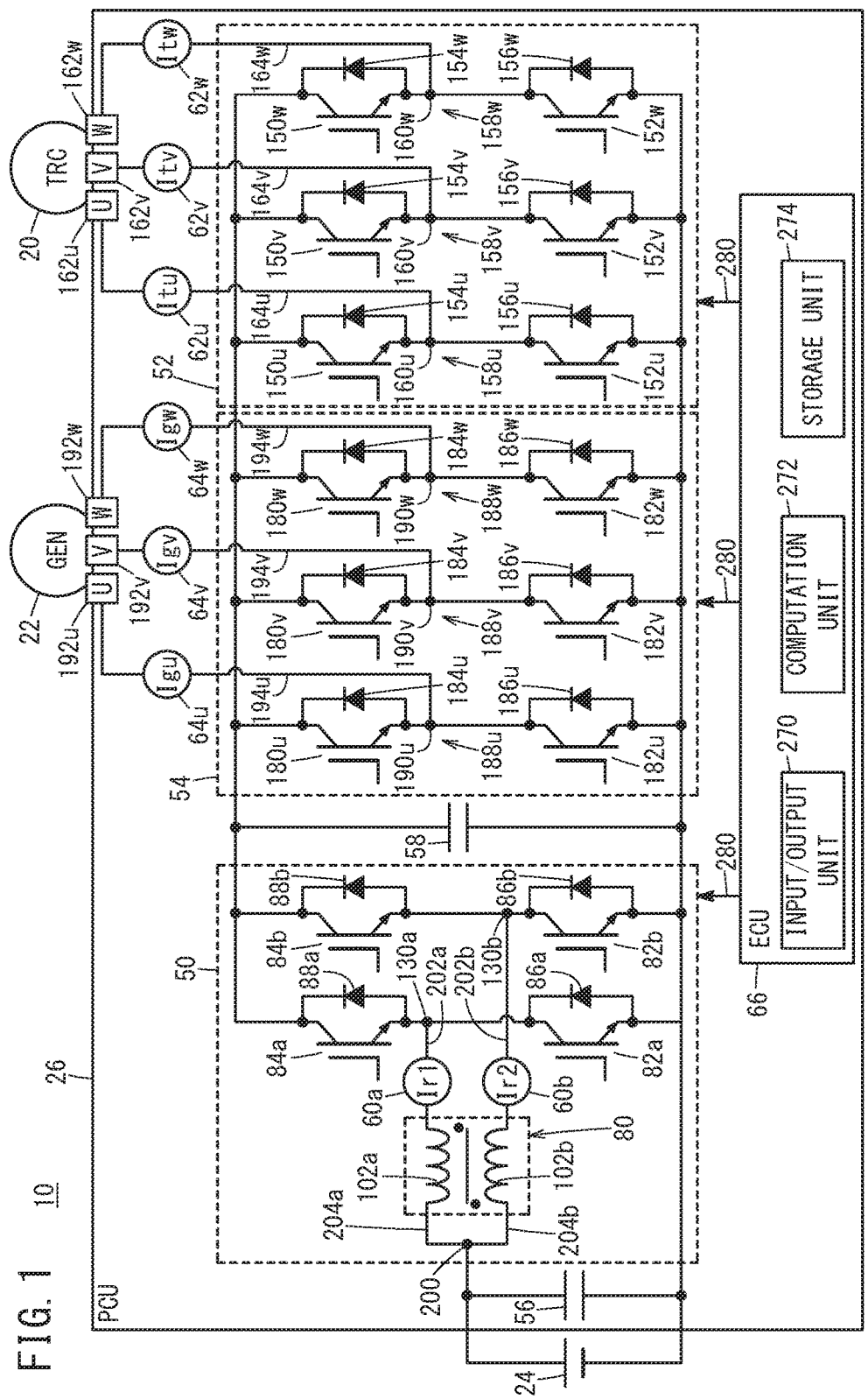
FIG. 1 is an electric circuit diagram schematically showing a vehicle including a power control unit (hereinafter referred to as the "PCU") as electric equipment according to one embodiment of the present invention.

FIG. 1 is an electric circuit diaphragm schematically showing structure of a vehicle 10 including a power control unit 26 (hereinafter referred to as the "PCU 26") as electric equipment according to one embodiment of the present invention. In addition to the PCU 26, the vehicle 10 includes a traction motor 20, a generator 22, and a high voltage battery 24 (hereinafter also referred to as the "battery 24" or "BAT 24"). The vehicle 10 is a hybrid vehicle. As a traction drive source, the vehicle 10 includes an engine (not shown) in addition to the traction motor 20. As described later, the vehicle 10 may be a vehicle of another type. The generator 22 performs power generation based on a drive force of the engine. The generator 22 may be used as the traction drive source.

The PCU 26 converts or adjusts electric power from the battery 24, and supplies the electric power to the traction motor 20. Further, the PCU 26 converts or adjusts power generation electric power Pgen of the generator 22 and power generation electric power (regenerative electric power Preg) of the traction motor 20 to charge the battery 24.

[A-1-2. Traction Motor 20]

For example, the traction motor 20 is a three-phase AC brushless type motor. The traction motor 20 generates a drive force Ftrc as a traction drive source of the vehicle 10, and provides the driving force Ftrc for the wheels (drive wheels) (not shown). That is, the traction motor 20 is driven by one of, or by both of electric power Pbat from the high voltage battery 24 and the electric power Pgen from the generator 22. Further, the traction motor 20 performs regenerative operation at the time of braking the vehicle 10, and supplies the regenerative electric power Preg to the battery 24. The regenerative electric power Preg may be supplied to electric auxiliary equipment (not shown).

Hereinafter, the traction motor 20 may also be referred to as the TRC motor 20 or the motor 20. The TRC motor 20 may have the function of a generator, in addition to, or instead of the function of the traction motor. Hereinafter, the parameters related to the traction motor 20 are labeled with "TRC" or "trc", or "t". Further, in FIG. 1, etc. the traction motor 20 is labeled with "TRC".

[A-1-3. Generator 22]

The generator 22 is a three-phase AC brushless type generator, and functions as a generator for performing power generation using the drive force Feng from the engine. The electric power Pgen generated by the generator 22 is supplied to the battery 24, the traction motor 20, or electrically operated auxiliary devices.

Hereinafter, the generator 22 will also be referred to as the GEN 22. The GEN 22 may have the function of a traction motor, in addition to, or instead of the function of the generator (power generator). Hereinafter, the parameters related to the generator 22 are labeled with "GEN" or "gen", or "g". Further, in FIG. 1, etc. the generator 22 is labeled with "GEN". The generator 22 may be used as a starter motor of the engine.

[A-1-4. High Voltage Battery 24]

The high voltage battery 24 is an energy storage including a plurality of battery cells, and capable of outputting high voltage (several hundreds of volts). For example, a lithium ion secondary battery, or a nickel hydrogen (or nickel-metal hydride) secondary battery may be used as the high voltage battery 24. Instead of, or in addition to the battery 24, an energy storage such as a capacitor may be used.

[A-1-5. PCU 26]

(A-1-5-1. Overview of PCU 26)

The PCU 26 converts or adjusts the electric power from the battery 24, and supplies the electric power to the traction motor 20. Further, the PCU 26 converts or adjusts the power generation electric power Pgen of the generator 22 and the regenerative electric power Preg of the traction motor 20, and charges the battery 24.

As shown in FIG. 1, the PCU 26 includes a DC/DC converter 50, a first inverter 52, a second inverter 54, a first capacitor 56, a second capacitor 58, reactor electric current sensors 60a, 60b, TRC electric current sensors 62u, 62v, 62w, GEN electric current sensors 64u, 64v, 64w, and an electronic control device (or an electronic control unit) 66 (hereinafter referred to as the "ECU 66").

(A-1-5-2. DC/DC Converter 50)

(A-1-5-2-1. Overview of DC/DC Converter 50)

The DC/DC converter 50 (hereinafter also referred to as the "converter 50) is a step-up/down (voltage boost/buck) converter. The converter 50 steps up the output voltage Vbat (hereinafter also referred to as the "battery voltage Vbat") of the battery 24, and outputs the stepped up voltage to the TRC motor 20. Further, the converter 50 steps down the output voltage Vgen (hereinafter also referred to as the "GEN voltage Vgen") of the generator 22 or the output voltage Vreg (hereinafter also referred to as the "regenerative voltage Vreg") of the traction motor 20, and outputs the stepped down voltage to the battery 24.

The converter 50 includes a reactor 80, lower switching elements 82a, 82b, and upper switching elements 84a, 84b. Diodes 86a, 86b, 88a, 88b are connected to the lower switching elements 82a, 82b and the upper switching elements 84a, 84b in parallel, respectively.

At the time of stepping up the battery voltage Vbat, after turning on the lower switching elements 82a, 82b at the same time to store electric energy in the reactor 80, the lower switching elements 82a, 82b are turned off at the same time to release the electric energy stored in the reactor 80 to the traction motor 20. When the GEN voltage Vgen or the regenerative voltage Vreg is stepped down, the upper switching elements 84a, 84b are turned on to store electric energy in the reactor 80, and then, the upper switching elements 84a, 84b are tuned off to charge the battery 24 using the electric energy stored in the reactor 80.

(A-1-5-2-2. Reactor 80)

Figure 2:
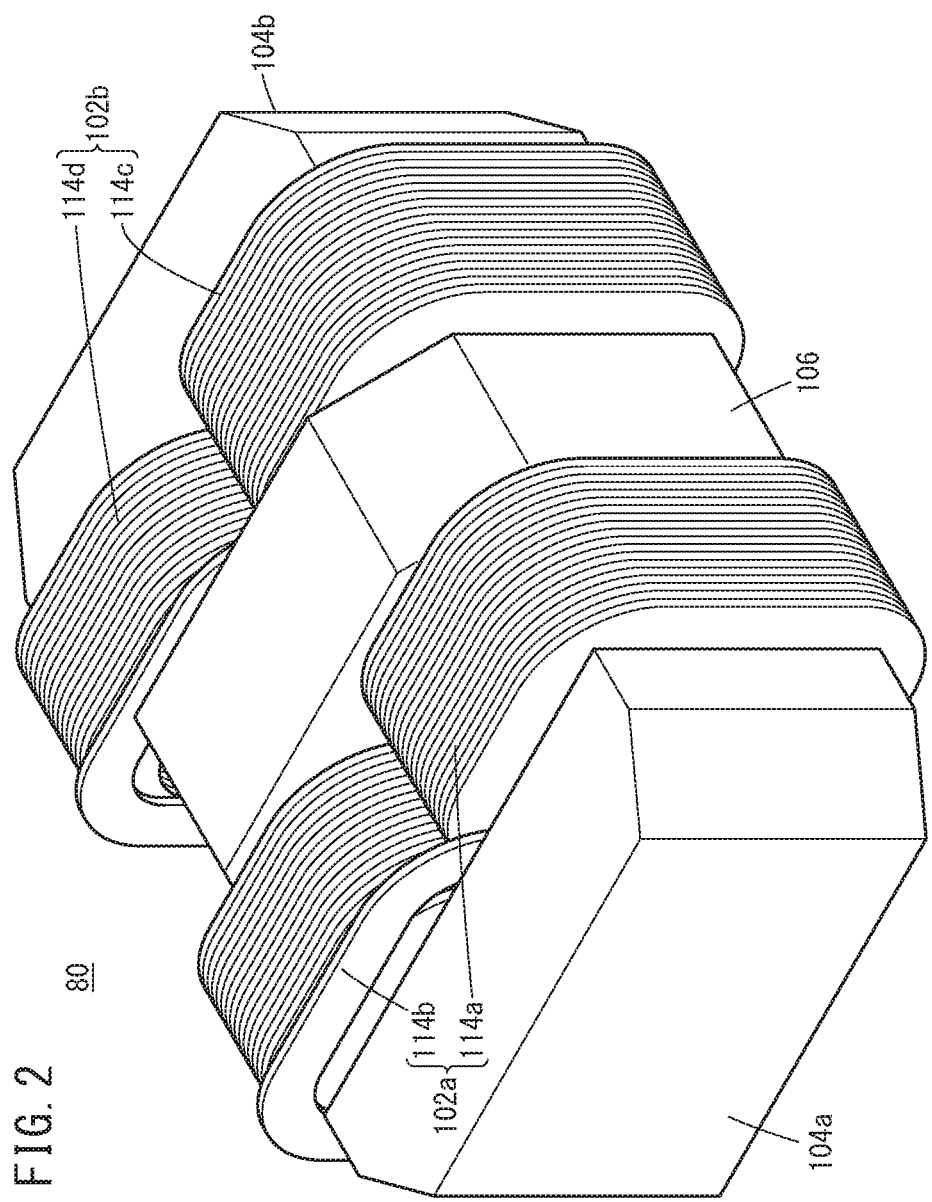
FIG. 2 is a perspective view schematically showing a reactor according to the embodiment.
Figure 3:
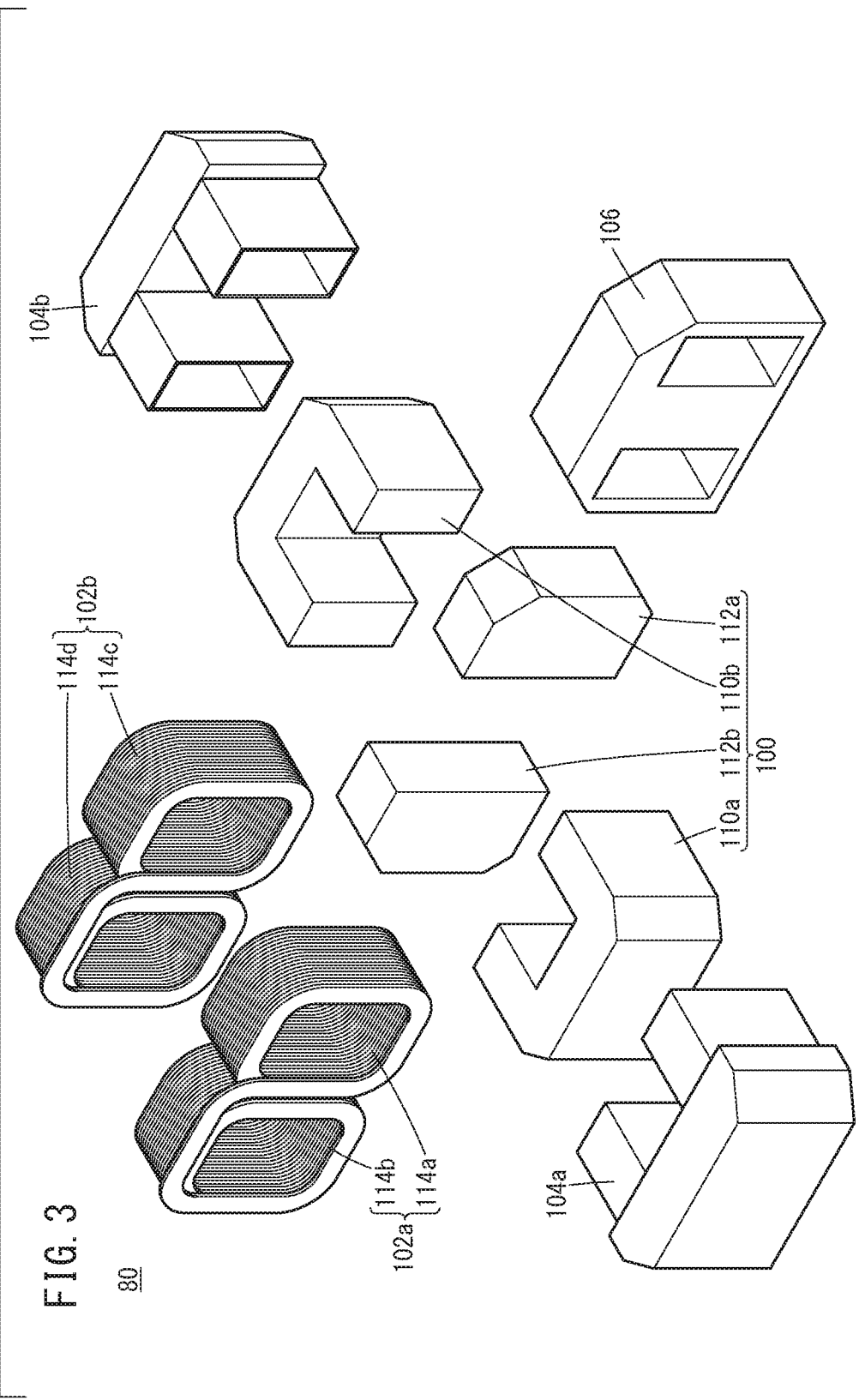
FIG. 3 is an exploded perspective view schematically showing the reactor according to the embodiment.

FIG. 2 is a perspective view schematically showing the reactor 80 according to an embodiment of the present invention. FIG. 3 is an exploded perspective view schematically showing the reactor 80 according to the embodiment. In the embodiment, though the reactor 80 is a magnetic coupling type reactor, the reactor 80 may be of a reactor of another type.

As shown in FIGS. 2 and 3, the reactor 80 includes an annular core 100 (FIG. 3), two coupling coils 102a, 102b, first core cover parts 104a, 104b, and a second core cover part 106. The annular core 100 is made up of combination of two U-shaped cores 110a, 110b, two I-shaped cores 112a, 112b to have a "θ" shape of Greek alphabet letter.

The coupling coil 102a is divided into a first winding part 114a and a second winding part 114b, and wound around the annular core 100. The coupling coil 102b is divided into a third winding part 114c and a fourth winding part 114d, and wound around the annular core 100.

The reactor 80 may adopt structure as described in any of Japanese Laid-Open Patent Publication No. 2010-197155 and Japanese Laid-Open Patent Publication No. 2016-066720.

(A-1-5-2-3. Lower Switching Elements 82a, 82b and Upper Switching Elements 84a, 84b)

As shown in FIG. 1, the lower switching element 82a is connected between the negative electrode of the battery 24 and a branch point 130a. The lower switching element 82b is connected between the negative electrode of the battery 24 and a branch point 130b. The upper switching element 84a is connected between the branch point 130a and a point between the traction motor 20 and the generator 22. The upper switching element 84b is connected between the branch point 130b and a point between the traction motor 20 and the generator 22.

The lower switching elements 82a, 82b and the upper switching elements 84a, 84b are made up of MOSFETs (metal-oxide-semiconductor field-effect transistors), IGBTs (insulated gate bipolar transistors), etc.

Figure 5:
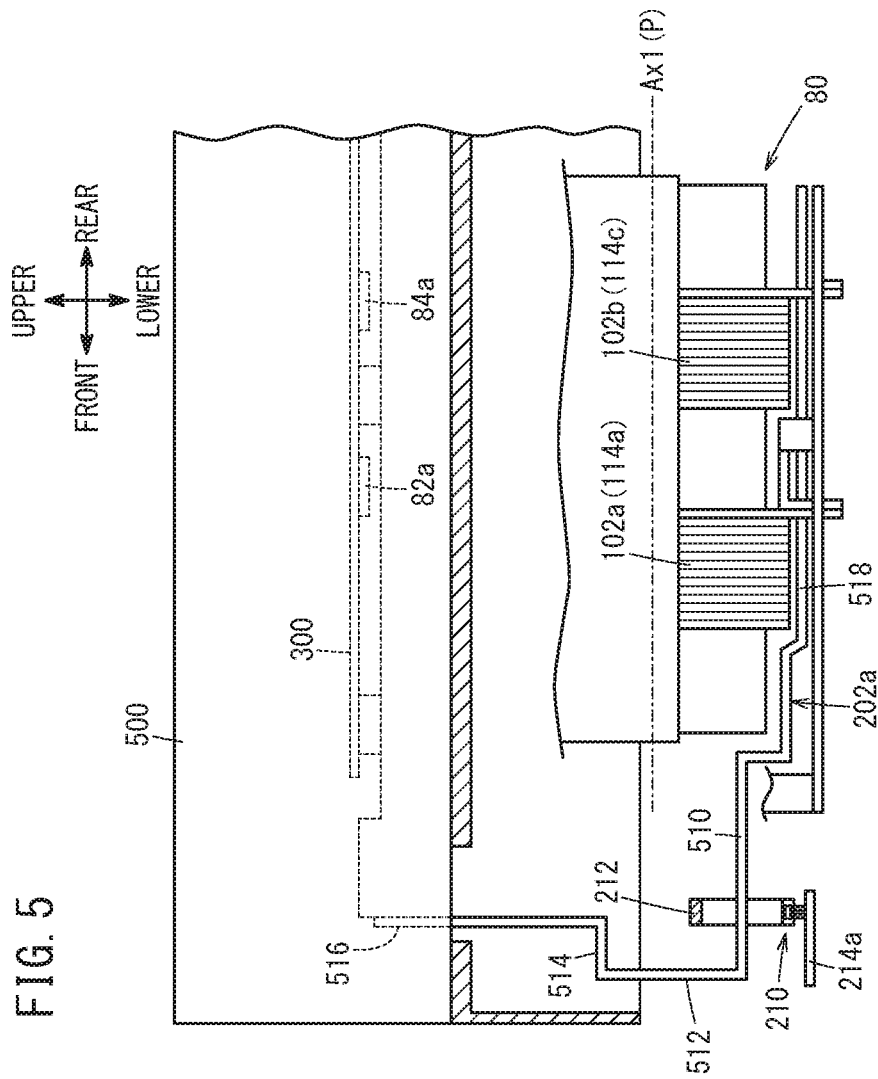
FIG. 5 is a cross sectional side view showing the reactor electric current sensors and an area around the reactor electric current sensors according to the embodiment.

The lower switching elements 82a, 82b and the upper switching elements 84a, 84b are provided on a switching substrate 300 (FIG. 5).

(A-1-5-3. First Inverter 52)

The first inverter 52 converts the DC electric current from the battery 24 to the AC electric current, and supplies the AC electric current to the traction motor 20. Further, the first inverter 52 converts AC electric current from the traction motor 20 into the DC electric current, and supplies the DC electric current to the battery 24.

As shown in FIG. 1, the first inverter 52 includes three-phase upper switching elements 150u, 150v, 150w, and three-phase lower switching elements 152u, 152v, 152w. Diodes 154u, 154v, 154w are connected to the upper switching elements 150u, 150v, 150w in parallel. Diodes 156u, 156v, 156w are connected to the lower switching elements 152u, 152v, 152w in parallel. The upper switching element 150u and the lower switching element 152u form a U-phase arm 158u. The upper switching element 150v and the lower switching element 152v form a V-phase arm 158v. The upper switching element 150w and the lower switching element 152w form a W-phase arm 158w.

In the U-phase arm 158u, a node 160u between the upper switching element 150u and the lower switching element 152u is connected to a U-phase terminal 162u of the traction motor 20 through a bus bar 164u. In the V-phase arm 158v, a node 160v between the upper switching element 150v and the lower switching element 152v is connected to a V-phase terminal 162v of the traction motor 20 through a bus bar 164v. In the W-phase arm 158w, a node 160w between the upper switching element 150w and the lower switching element 152w is connected to a W-phase terminal 162w of the traction motor 20 through a bus bar 164w. Hereinafter, the bus bars 164u, 164v, 164w will also be referred to as a bus bar 164, collectively.

The upper switching elements 150u, 150v, 150w and the lower switching elements 152u, 152v, 152w are provided on the switching substrate 300 (FIG. 5).

(A-1-5-4. Second Inverter 54)

The second inverter 54 converts the AC electric current from the generator 22 into the DC electric current, and supplies the DC electric current to the battery 24. Further, in the case where the generator 22 is used as a traction drive source, the second inverter 54 converts the DC electric current from the battery 24 into the AC electric current, and supplies the AC electric current to the generator 22.

As shown in FIG. 1, the second inverter 54 includes three-phase upper switching elements 180u, 180v, 180w, and three-phase lower switching elements 182u, 182v, 182w. Diodes 184u, 184v, 184w are connected to the upper switching elements 180u, 180v, 180w in parallel. Diodes 186u, 186v, 186w are connected to the lower switching elements 182u, 182v, 182w in parallel. The upper switching element 180u and the lower switching element 182u form a U-phase arm 188u. The upper switching element 180v and the lower switching element 182v form a V-phase arm 188v. The upper switching element 180w and the lower switching element 182w form a W-phase arm 188w.

In the U-phase arm 188u, a node 190u between the upper switching element 180u and the lower switching element 182u is connected to a U-phase terminal 192u of the generator 22 through a bus bar 194u. In the V-phase arm 188v, a node 190v between the upper switching element 180v and the lower switching element 182v is connected to a V-phase terminal 192v of the generator 22 through a bus bar 194v. In the W-phase arm 188w, a node 190w between the upper switching element 180w and the lower switching element 182w is connected to a W-phase terminal 192w of the generator 22 through a bus bar 194w. Hereinafter, the bus bars 194u, 194v, 194w are referred to as a bus bar 194, collectively.

The upper switching elements 180u, 180v, 180w and the lower switching elements 182u, 182v, 182w are provided on the switching substrate 300 (FIG. 5).

(A-1-5-5. First Capacitor 56 and Second Capacitor 58)

The first capacitor 56 and the second capacitor 58 function as smoothing capacitors.

(A-1-5-6. Reactor Electric Current Sensors 60a, 60b)
(A-1-5-6-1. Overview of Reactor Electric Current Sensors 60a, 60b)

The reactor electric current sensor 60a (FIG. 1) detects electric current Ir1 (hereinafter also referred to as the reactor electric current Ir1") flowing between the coupling coil 102a and the branch point 130a. Stated otherwise, the reactor electric current sensor 60a detects the electric current Ir1 flowing through a bus bar 202a connecting the coupling coil 102a and the branch point 130a. The reactor electric current sensor 60a may be provided between the positive electrode (branch point 200) of the battery 24 and the coupling coil 102a. Stated otherwise, the reactor electric current sensor 60a may detect electric current flowing through a bus bar 204a connecting the branch point 200 and the coupling coil 102a.

The reactor electric current sensor 60b detects the electric current (hereinafter also referred to as the "reactor electric current Ir2") flowing between the coupling coil 102b and the branch point 130b. Stated otherwise, the reactor electric current sensor 60b detects electric current Ir2 flowing through a bus bar 202b connecting the coupling coil 102b and the branch point 130b. The reactor electric current sensor 60b may be provided between the positive electrode (branch point 200) of the battery 24 and the coupling coil 102b. Stated otherwise, the reactor electric current sensor 60b may detect electric current flowing through a bus bar 204b connecting the branch point 200 and the coupling coil 102b.

Hereinafter, the reactor electric current sensors 60a, 60b will be referred to as the electric current sensor 60 or the sensor 60 collectively.

(A-1-5-6-2. Specific Structure of Reactor Electric Current Sensors 60a, 60b)

Figure 4:
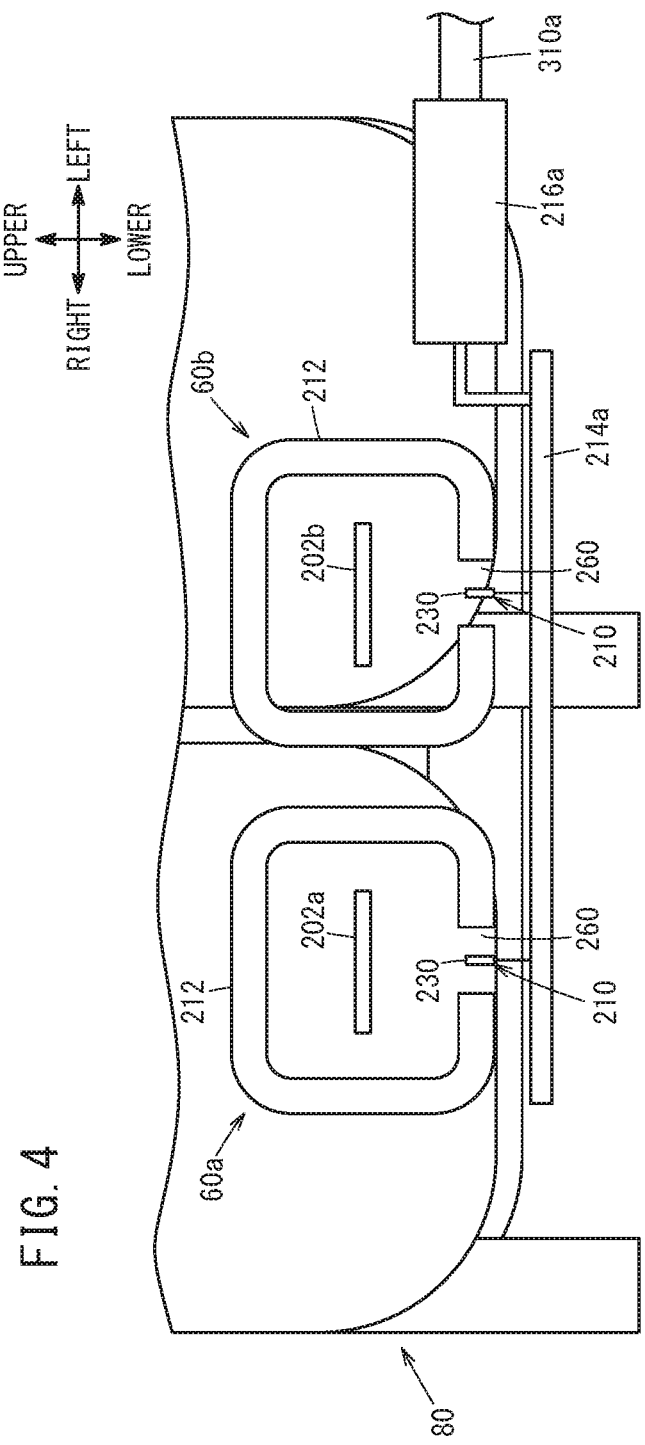
FIG. 4 is a front view showing reactor electric current sensors and an area around the reactor electric current sensors according to the embodiment.

FIG. 4 is a front view showing reactor electric current sensors 60a, 60b and an area around the reactor electric current sensors 60a, 60b according to the embodiment. FIG. 5 is a cross sectional side view showing the reactor electric current sensors 60a, 60b and an area around the reactor electric current sensors 60a, 60b according to the embodiment of the present invention. The directions shown in FIG. 4 and FIG. 5, and FIGS. 6 and 8 described later are based on the vehicle 10. Each of the electric current sensors 60a, 60b includes a Hall IC 210 (IC: integrated circuit), and a magnetic core 212 (hereinafter also referred to as the "core 212"). Further, the electric current sensors 60a, 60b have a common sensor substrate 214a. The Hall ICs 210 are fixed to, or implemented on a sensor substrate 214a. A wiring line 310a is connected to one end of the sensor substrate 214a through a connector 216a. The Hall IC 210 and the core 212 of the electric current sensor 60a and the Hall IC 210 and the core 212 of the electric current sensor 60b have the structure according to the same specification.

Figure 6:
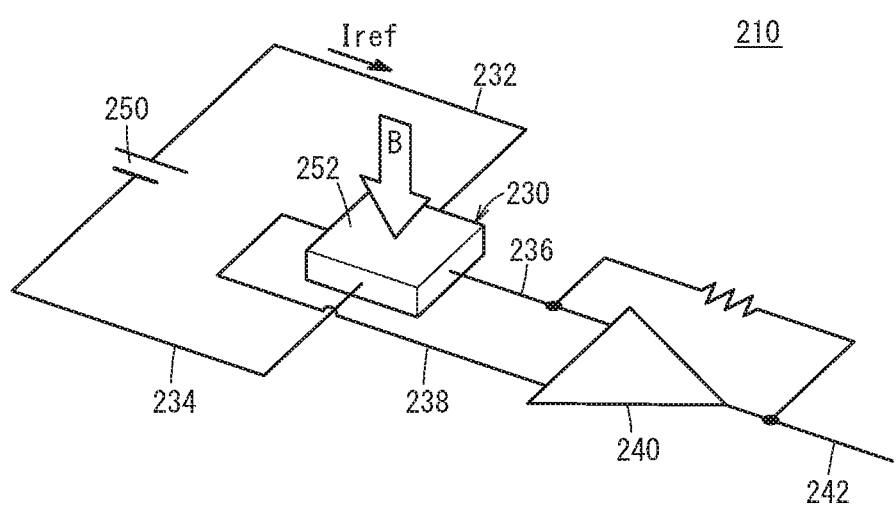
FIG. 6 is a view illustrating a detection principle of a Hall element included in a Hall IC according to the embodiment.

FIG. 6 is a view illustrating a detection principle of a Hall element 230 included in the Hall IC 210 according to the embodiment. The Hall element 230 is a magnetism detection element for detecting a magnetic field B or magnetic flux $\phi$. Though the Hall element 230 is known in general, for ease of understanding of the embodiment of the present invention, the description about the Hall element 230 will be given below.

The Hall IC 210 includes, in addition to the Hall element 230, a power supply voltage line 232, a ground line 234, and output lines 236, 238. The output lines 236, 238 are connected to an operational amplifier 240, and the output of the operational amplifier 240 is supplied to a signal line 242. In the Hall IC 210, the power supply voltage line 232 and the ground line 234 are connected to a low voltage power supply 250, and electric current (reference electric current Iref) is supplied to the power supply voltage line 232 and the ground line 234. In this state, when the magnetic field B is applied perpendicularly to a magnetic field detection surface 252 of the Hall element 230, (stated otherwise, when the magnetic field B is applied perpendicularly to the reference electric current Iref), an electromotive force E is generated in a direction perpendicular to the reference electric current Iref and the magnetic field B (i.e., the output lines 236, 238).

Therefore, by collecting the electromotive force E through the operational amplifier 240, it is possible to know the intensity of the magnetic field B (or electric current which generates the magnetic field B).

The core 212 (FIG. 4) is made of magnetic material basically in the form of an annular shape. A gap 260 is formed in part of the core 212, for providing the Hall element 230. An air as insulating material is present between the Hall element 230 and the core 212. Insulating material other than the air may be provided between the Hall element 230 and the core 212. Using the core 212, it is possible to converge the magnetic flux ϕ generated around detection target conductors (bus bars 202*a*, 202*b* herein), and improve the sensitivity of the Hall element 230.

As can be seen from FIG. 4, in the state where the Hall element 230 is provided in the gap 260, the Hall element 230 is provided such that the magnetic field detection surface 252 (FIG. 6) of the Hall element 230 faces the core 212. Further, part of the Hall IC 210 other than the Hall element 230 is provided on the sensor substrate 214*a*. Though the Hall element 230 is described as part of the Hall IC 210, the Hall element 230 may be handled as a component part which is provided separately from the Hall IC 210.

In the embodiment of the present invention, component parts of the reactor electric current sensors 60*a*, 60*b*, etc. are provided in consideration of the leakage magnetic flux ϕ1 by the AC magnetic field generated by the reactor 80. The layout of the sensors 60*a*, 60*b*, etc. will be described with reference to FIGS. 4, 5, and 7 to 9.

(A-1-5-7. TRC Electric Current Sensors 62*u*, 62*v*, 62*w*)
(A-1-5-7-1. Overview of TRC Electric Current Sensors 62*u*, 62*v*, 62*w*)

As shown in FIG. 1, TRC electric current sensors 62*u*, 62*v*, 62*w* (hereinafter also referred to as the "electric current sensors 62*u*, 62*v*, 62*w*" or the "sensors 62*u*, 62*v*, 62*w*") detect electric currents Itu, Itv, Itw flowing between the first inverter 52 and the traction motor 20.

More specifically, the sensor 62*u* detects electric current Itu (hereinafter also referred to as the "TRC electric current Itu" or the "U-phase electric current Itu") flowing through the bus bar 164*u* connecting the U-phase arm 158*u* and the U-phase terminal 162*u* of the motor 20. The sensor 62*v* detects electric current Itv (hereinafter also referred to as the "TRC electric current Itv" or the "V-phase electric current Itv") flowing through the bus bar 164*v* connecting the V-phase arm 158*v* and the V-phase terminal 162*v* of the motor 20. The sensor 62*w* detects electric current Itw (hereinafter also referred to as the "TRC electric current Itw" or the "W-phase electric current Itw") flowing through the bus bar 164*w* connecting the W-phase arm 158*w* and the W-phase terminal 162*w* of the motor 20.

Hereinafter, the TRC electric current sensors 62*u*, 62*v*, 62*w* will be referred to as the TRC electric current sensor 62 or the sensor 62 collectively. Further, the electric currents Itu, Itv, Itw will be referred to as the electric current It collectively. In the embodiment of the present invention, the number of the sensors 62 is three. Alternatively, the number of the sensors 62 may be two or four or more.

(A-1-5-7-2. Specific Structure of TRC Electric Current Sensors 62*u*, 62*v*, 62*w*)

The TRC electric current sensors 62*u*, 62*v*, 62*w* have the same structure as the reactor electric current sensors 60*a*, 60*b*. That is, each of the sensors 62*u*, 62*v*, 62*w* includes the Hall element 230, the magnetic core 212, and a sensor substrate 214*b* used in common by the sensors 62*u*, 62*v*, 62*w*. A wiring line 310*b* is connected to one end of the sensor substrate 214*b* through a connector 216*b*. The wiring line 310*b* will be described later with reference to FIGS. 7 to 9.

(A-1-5-8. GEN Electric Current Sensors 64*u*, 64*v*, 64*w*)
(A-1-5-8-1. Overview of GEN Electric Current Sensors 64*u*, 64*v*, 64*w*)

As shown in FIG. 1, GEN electric current sensors 64*u*, 64*v*, 64*w* (hereinafter also referred to as the "electric current sensors 64*u*, 64*v*, 64*w*" or the "sensors 64*u*, 64*v*, 64*w*") detect electric currents Igu, Igv, Igw flowing between the second inverter 54 and the generator 22.

More specifically, the sensor 64*u* detects electric current Igu (hereinafter also referred to as the "GEN electric current Igu" or the "U-phase electric current Igu") flowing through the bus bar 194*u* connecting the U-phase arm 188*u* and the U-phase terminal 192*u* of the generator 22. The sensor 64*v* detects electric current Igv (hereinafter also referred to as the "GEN electric current Igv" or the "V-phase electric current Igv") flowing through the bus bar 194*v* connecting the V-phase arm 188*v* and the V-phase terminal 192*v* of the generator 22. The sensor 64*w* detects electric current Igw (hereinafter also referred to as the "GEN electric current Igw" or the "W-phase electric current Igw") flowing through the bus bar 194*w* connecting the W-phase arm 188*w* and the W-phase terminal 192*w* of the generator 22.

Hereinafter, the GEN electric current sensors 64*u*, 64*v*, 64*w* will be referred to as the GEN electric current sensor 64 or the sensor 64 collectively. Further, the electric currents Igu, Igv, Igw will be referred to as the electric current Ig collectively. In the embodiment of the present invention, the number of the sensors 64 is three. Alternatively, the number of the sensors 64 may be two or four or more.

(A-1-5-8-2. Specific Structure of GEN Electric Current Sensors 64*u*, 64*v*, 64*w*)

The GEN electric current sensors 64*u*, 64*v*, 64*w* have the same structure as the reactor electric current sensors 60*a*, 60*b* and the TRC electric current sensors 62*u*, 62*v*, 62*w*. That is, each of the sensors 64*u*, 64*v*, 64*w* includes the Hall element 230, a magnetic core 212, and a common sensor substrate 214*c* used in common by the sensors 64*u*, 64*v*, 64*w*. A wiring line 310*c* is connected to one end of the sensor substrate 214*c* through a connector 216*c*. The wiring line 310*c* will be described later with reference to FIGS. 7 to 9.

(A-1-5-9. ECU 66)

The ECU 66 is a control circuit (or control device) for controlling components of the PCU 26. The ECU 66 includes an input/output unit 270, a computation unit 272, and a storage unit 274. The input/output unit 270 inputs/outputs signals to/from components of the vehicle 10 through a signal line 280 (communications line). In FIG. 1, it should be noted that the communications line 280 is shown in a simplified form. The input/output unit 270 includes an A/D converter circuit (not shown) for converting an inputted analog signal to a digital signal.

The computation unit 272 includes a central computation unit (CPU), and the computation unit 272 is operated by executing a program stored in the storage unit 274. Some of the functions of the computation unit 272 may be realized by a logic IC (integrated circuit). The program may be supplied from the outside through a wireless communications device (not shown) (portable phone, smart phone, etc.). In the computation unit 272, part of the program may be made up of hardware (circuit component part).

The computation unit 272 of the embodiment of the present invention performs switching of the reactor 80 using a certain value, e.g., in the range of 10 to 20 kHz. Further, the computation unit 272 converts outputs from the TRC electric current sensors 62u, 62v, 62w and the GEN electric current sensors 64u, 64v, 64w into digital values, and uses the digital values.

The storage unit 274 stores programs and data used by the computation unit 272, and includes a random access memory (hereinafter referred to as the "RAM"). As the RAM, a volatile memory such as a register, and a non-volatile memory such as a flash memory may be used. Further, the storage unit 274 may include a read only memory (hereinafter referred to as the "ROM"), in addition to the RAM.

A-2. Layout of Component Parts of PCU 26

(A-2-1. Overview)

Figure 7:
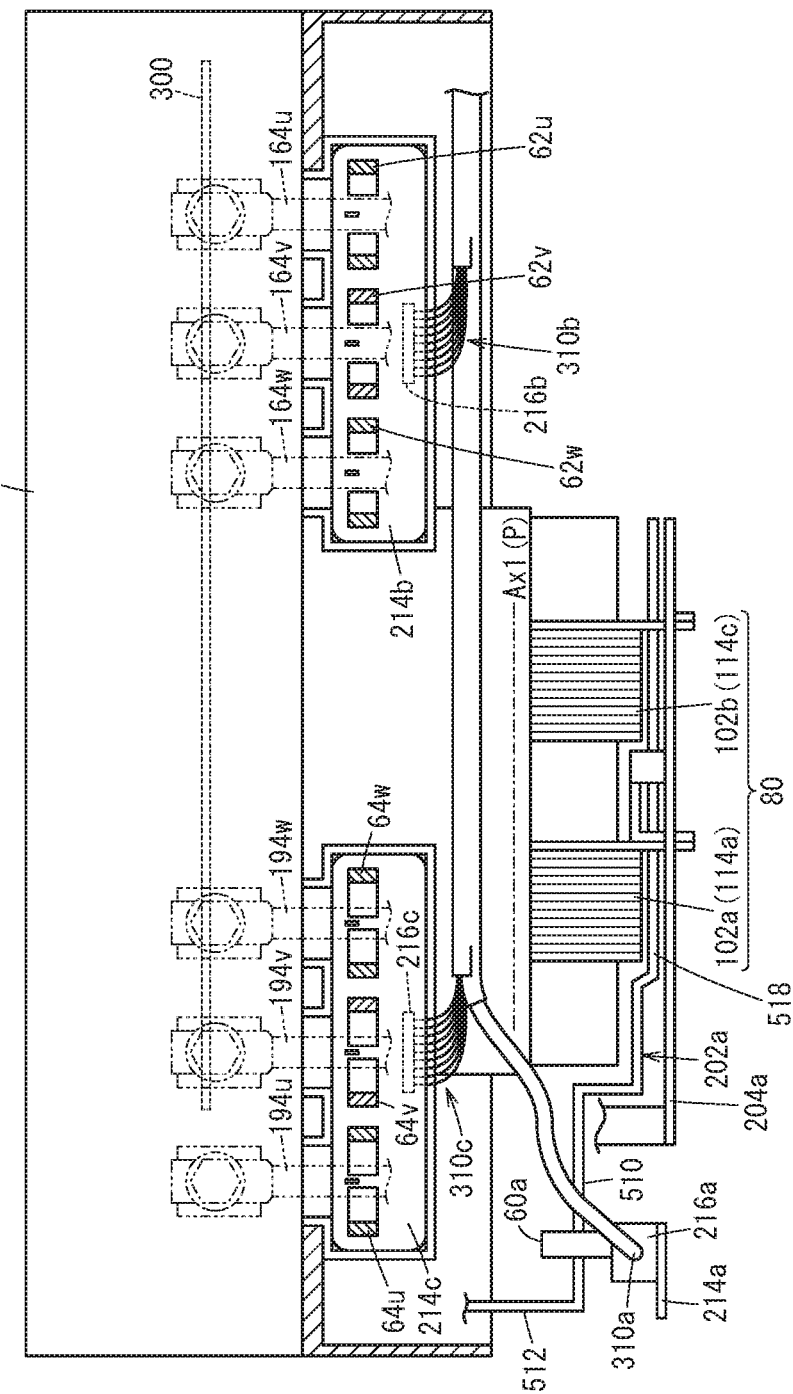
FIG. 7 is a side view schematically showing the layout of a part of the PCU according to the embodiment.
Figure 9:
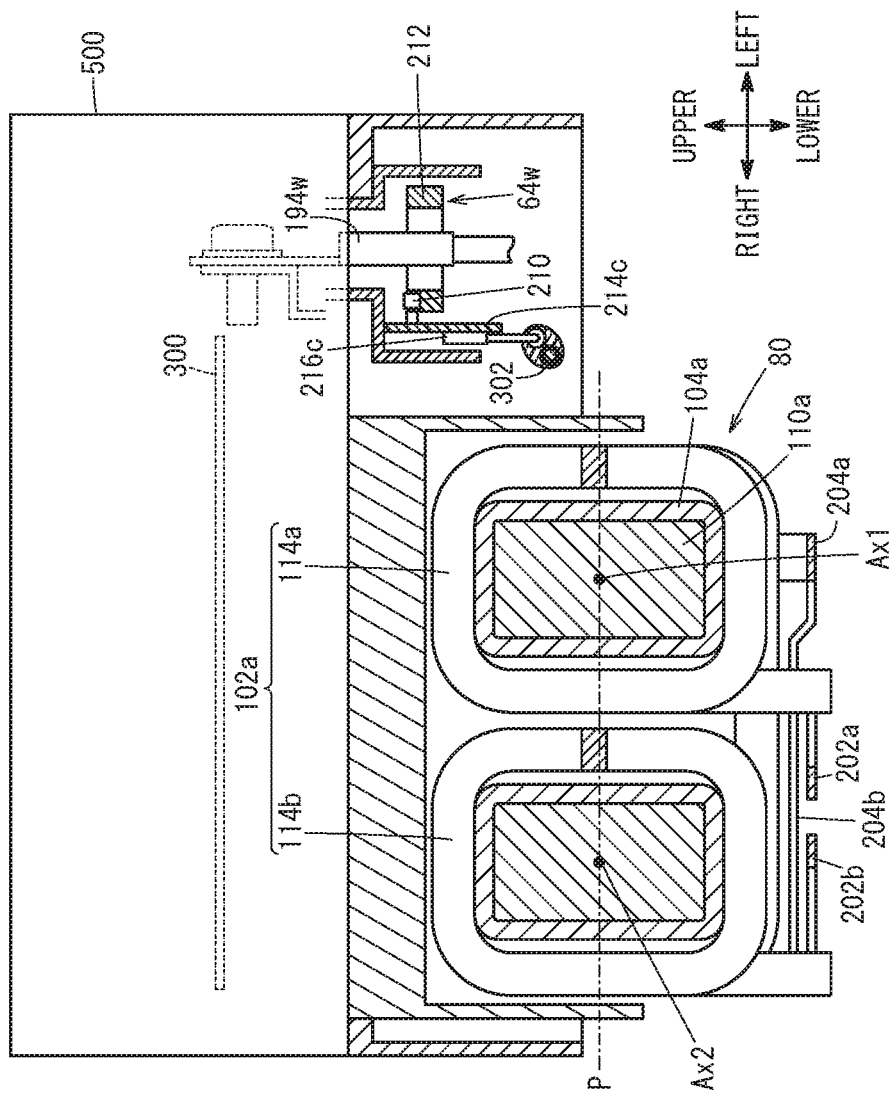
FIG. 9 is a front view schematically showing the layout of a part of the PCU according to the embodiment.

Next, layout of component parts of the PCU 26 will be described. In the embodiment of the present invention, in order to reduce the size of the vehicle 10 in the front/rear direction, a part of the switching substrate 300 is overlapped with the reactor 80 (FIGS. 7 and 9). In this regard, the component parts of the PCU 26 are arranged in a manner that the influence of the leakage magnetic flux 4l from the reactor 80 becomes small.

Figure 8:
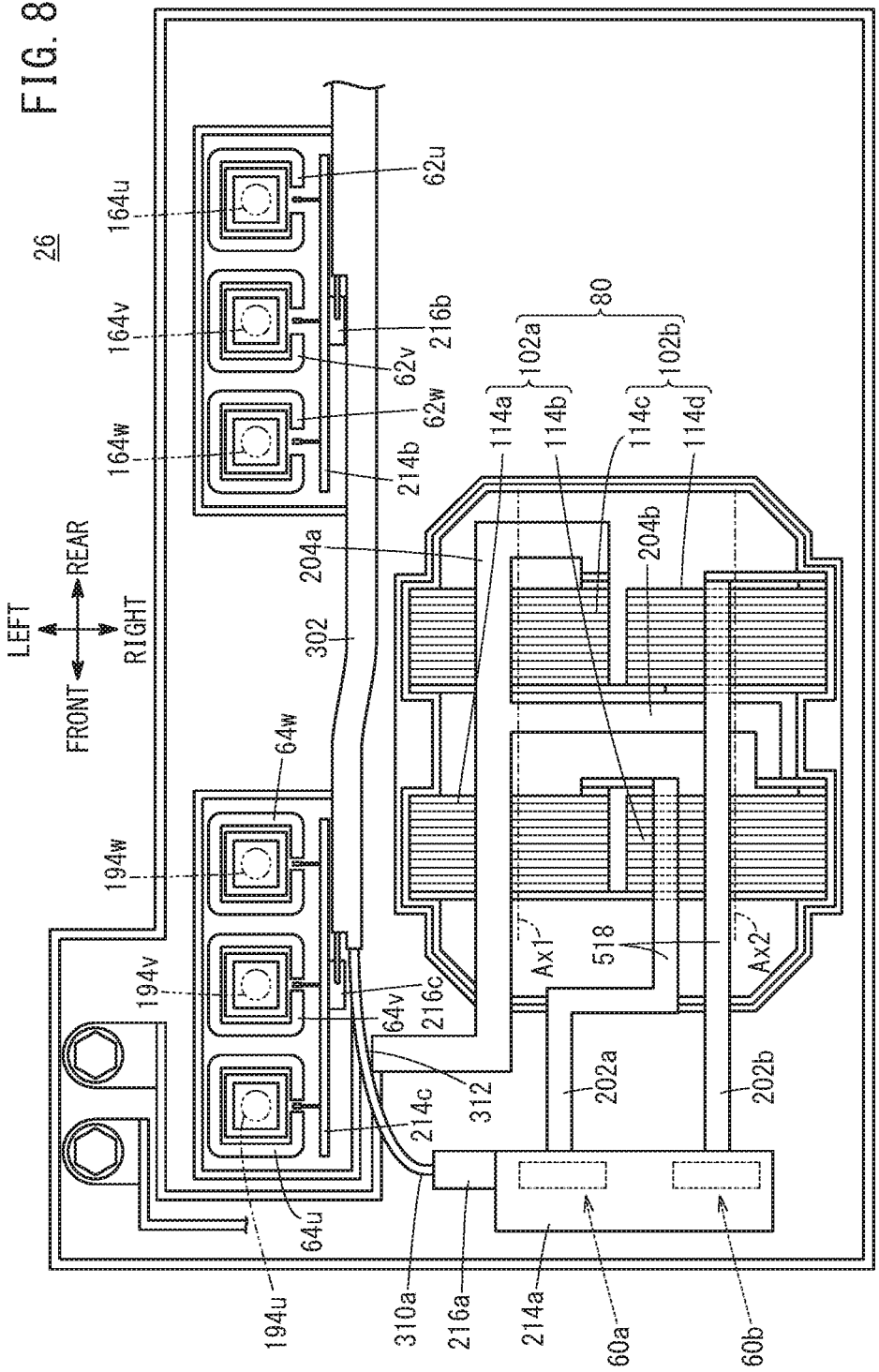
FIG. 8 is a bottom view schematically showing the layout of a part of the PCU according to the embodiment.

FIG. 7 is a side view schematically showing the layout of a part of the PCU 26 according to the embodiment. FIG. 8 is a bottom view schematically showing the layout of a part of the PCU 26 according to the embodiment. FIG. 9 is a front view schematically showing the layout of a part of the PCU 26 according to the embodiment. As described above, the directions shown in FIGS. 7 to 9 are based on the vehicle 10.

A reference numeral 500 in FIGS. 7 and 9 denotes a switching unit formed by assembling switching elements of the converter 50, the first inverter 52, and the second inverter 54. The switching unit 500 (electric circuit) includes lower switching elements 82a, 82b and upper switching elements 84a, 84b of the converter 50, upper switching elements 150u, 150v, 150w and lower switching elements 152u, 152v, 152w of the first inverter 52, and upper switching elements 180u, 180v, 180w and lower switching elements 182u, 182v, 182w of the second inverter 54. The switching unit 500 includes the ECU 66 and the switching substrate 300 as well.

(A-2-2. Leakage Magnetic Flux φ1 by AC Magnetic Field of the Reactor 80)

FIG. 10 is a plan view showing an example of a magnetic flux (leakage magnetic flux φ1) generated by the reactor 80 according to the embodiment of the present invention. In FIG. 10, a part of the reactor 80 (I shaped cores 112a, 112b, etc.) is not shown. As shown in FIG. 10, in the magnetic coupling type reactor 80, a magnetic field is generated around each of the first winding part 114a, the second winding part 114b, the third winding part 114c, and the fourth winding part 114d.

As described above, in the embodiment of the present invention, switching of the lower switching elements 82a, 82b and the upper switching elements 84a, 84b is performed to change the orientation of the magnetic field (leakage magnetic flux φ1). Therefore, it should be noted that the orientation of the magnetic field (leakage magnetic flux φ1) shown in FIG. 10 is an example (typical direction).

As shown in FIGS. 7 to 9, the magnetic coupling type reactor 80 is provided at a lower position of the PCU 26. In this regard, the coil axes Ax1, Ax2 are oriented in the front/rear direction of the vehicle 10. The coil axis Ax1 (winding axis) is the central axis of the first winding part 114a and the third winding part 114c. The coil axis Ax2 is the central axis of the second winding part 114b and the fourth winding part 114d. The coil axes Ax1, Ax2 are in parallel to each other. Hereinafter, a virtual plane defined by the coil axes Ax1, Ax2 will be referred to as the virtual plane P.

(A-2-3. Layout of Switching Substrate 300)

As shown in FIGS. 5, 7, and 9, the switching substrate 300 is provided along the axes of the reactor 80 (coil axes Ax1, Ax2). Further, as shown in FIGS. 7 to 9, a part of the switching substrate 300 is overlapped with the reactor 80, as viewed in the upper/lower direction of the vehicle 10 (stated otherwise, in the direction perpendicular to the virtual plane P).

(A-2-4. Layout of Hall Element 230)

When the leakage magnetic flux φ1 is generated from the reactor 80, if the leakage magnetic flux φ1 enters perpendicularly to the magnetic field detection surface 252 of the Hall element 230, the output of the Hall element 230 is influenced by the leakage magnetic flux 4l. In the embodiment of the present invention, the Hall element 230 is arranged in a manner that the Hall element 230 is not influenced by the leakage magnetic flux 4l from the reactor 80.

Specifically, as can be seen from FIGS. 4 and 5, etc., the magnetic field detection surface 252 of the Hall element 230 is oriented in a direction (left/right direction) perpendicular to the direction of the coil axes Ax1, Ax2 (front/rear direction of the vehicle 10). Further, as shown in FIG. 4, etc., the Hall element 230 is provided at a position overlapped with the reactor 80, as viewed in the front/rear direction of the vehicle 10 (direction of the coil axes Ax1, Ax2). Further, as shown in FIG. 5, etc., the Hall element 230 is positioned between a first plate part 510 (described later) of the bus bar 202a and the sensor substrate 214a.

(A-2-5. Layout of Sensor Substrate 214a)

When the magnetic flux φ generated from the reactor 80 enters the power supply voltage line 232, the ground line 234, the output lines 236, 238, and the signal line 242 (i.e., pattern (not shown), etc. formed in the sensor substrate 214a), an eddy current effect is created. This eddy current effect may cause errors in the outputs of the sensors 60a, 60b. Therefore, the layout of the sensor substrate 214a is determined in the following manner.

That is, as shown in FIGS. 4 and 5, etc., the sensor substrate 214a is provided in parallel to the switching substrate 300. Further, the sensor substrate 214a is shifted from the reactor 80 in the front/rear direction of the vehicle 10 (direction of the coil axes Ax1, Ax2), as viewed in the upper/lower direction of the vehicle 10 (direction perpendicular to the virtual plane P).

(A-2-6. Layout of Bus Bars 202a, 202b)

In order to provide the switching substrate 300, the Hall element 230, and the sensor substrate 214a as described above, the bus bar 202a has the following structure and the layout (the bus bar 202b has the same structure and the same layout as well). That is, as shown in FIG. 5, the bus bar 202a includes the first plate part 510, a second plate part 512, a third plate part 514, a fourth plate part 516, and a fifth plate part 518.

As shown in FIGS. 4 and 5, etc., the first plate part 510 is provided in parallel to the switching substrate 300, between the second plate part 512 and the fifth plate part 518. Further, the first plate part 510 is overlapped with the reactor 80, as viewed in the front/rear direction of the vehicle 10 (direction of the coil axes Ax1, Ax2). Further, a part of the first plate part 510 is overlapped with the switching substrate 300, as viewed in the direction perpendicular to the virtual plane P.

The second plate part 512 is provided between the first plate part 510 and the third plate part 514. As shown in FIG. 5, etc., the second plate part 512 is positioned between the switching substrate 300 and the sensor substrate 214a, and extends in a direction perpendicular to the first plate part 510, as viewed in a direction parallel to the virtual plane P.

As shown in FIG. 5, the third plate part 514 is positioned between the second plate part 512 and the fourth plate part 516. The third plate part 514 is in parallel to the first plate part 510 and the switching substrate 300. As shown in FIG. 5, the fourth plate part 516 is positioned between the third plate part 514 and the switching substrate 300. The fourth plate part 516 is in parallel to the second plate part 512.

The third plate part 514 and the fourth plate part 516 are positioned between the switching substrate 300 and the first plate part 510, as viewed in the front/rear direction of the vehicle 10 (direction of the coil axes Ax1, Ax2). Further, the third plate part 514 and the fourth plate part 516 are positioned between the reactor 80 and the second plate part 512 in the front/rear direction of the vehicle 10 (in the direction of the coil axes Ax1, Ax2), as viewed in the upper/lower direction of the vehicle 10 (direction perpendicular to the virtual plate surface P).

The fifth plate part 518 is provided between the first plate part 510 and the reactor 80. The fifth plate part 518 is expanded to a position below the vehicle 10 to connect the first plate part 510 and the reactor 80 (coupling coil 102a). In the structure, the first plate part 510 can be overlapped with the reactor 80 in the front/rear direction of the vehicle 10 (direction of the coil axes Ax1, Ax2).

A-3. Advantages of the Embodiment of the Present Invention

In the embodiment of the present invention, the switching substrate 300 is provided in the front/rear direction of the vehicle 10 (along the coil axes Ax1, Ax2) (FIGS. 7 and 9). Further, the switching substrate 300 is arranged in a manner that a part of the switching substrate 300 is overlapped with the reactor 80 (FIGS. 7 and 9), as viewed in the upper/lower direction of the vehicle 10 (direction perpendicular to the virtual plane P). In the structure, it becomes possible to achieve size reduction of the PCU 26 (electric equipment), in the direction of the coil axes Ax1, Ax2.

Further, in the embodiment of the present invention, the electric current sensors 60a, 60b are shifted from the reactor 80 in the direction of the coil Ax1, Ax2 (FIGS. 7 and 8). Further, the sensor substrate 214a is provided in parallel to the virtual plane P (FIGS. 7 and 8). Therefore, by suppressing interlinkage of the AC magnetic field generated from the reactor 80 with the sensor substrate 214a, it becomes possible to suppress detection errors of the electric current sensors 60a, 60b.

Further, in the embodiment of the present invention, the first plate part 510 is positioned between the switching substrate 300 and the sensor substrate 214a (FIGS. 5, 7, and 8). Thus, it becomes possible to avoid increase in the size of the PCU 26 in the front/rear direction of the vehicle 10 (axial direction of the reactor 80).

That is, assuming that the sensor substrate 214a is positioned opposite to the first plate part 510, between the switching substrate 300 and the first plate part 510, it may be required to extend the first plate part 510 in the front/rear direction of the vehicle 10 (axial direction of the reactor 80). In contrast, by providing the first plate part 510 between the switching substrate 300 and the sensor substrate 214a, influence of the size of the sensor substrate 214a on the size of the first plate part 510 is reduced. Accordingly, it becomes possible to avoid increase in the size of the PCU 26 in the front/rear direction of the vehicle 10 (axial direction of the reactor 80).

In the embodiment of the present invention, the Hall element 230 (detection element) is arranged between the first plate part 510 and the sensor substrate 214a (FIGS. 4 and 5), as viewed in the front/rear direction of the vehicle 10 (direction parallel to the virtual plane P), and the upper/lower direction of the vehicle 10 (direction perpendicular to the virtual plane P), respectively. As a result, in the state where the distance between the sensor substrate 214a and the first plate part 510 is kept relatively long, by providing the Hall element 230 close to the first plate part 510, it becomes possible to improve the detection sensitivity of the Hall element 230.

In the embodiment of the present invention, the Hall element 230 (detection element) is overlapped with the reactor 80 as viewed in the front/rear direction of the vehicle 10 (axial direction of the coil axes Ax1, Ax2) (FIG. 4, etc.). Further, the magnetic field detection surface 252 of the Hall element 230 is oriented in the direction perpendicular to the front/rear direction of the vehicle 10 (axial direction of the reactor 80) (FIGS. 4, 10, etc.). Thus, it becomes possible to suppress interlinkage of the AC current magnetic field generated from the reactor 80 with the Hall element 230, and suppress detection errors of the electric current sensors 60a, 60b to a greater extent.

In the embodiment of the present invention, the first plate part 510 of the bus bars 202a, 202b is overlapped with the reactor 80, as viewed in the front/rear direction of the vehicle 10 (direction of the coil axes Ax1, Ax2) (FIG. 4, etc.). Thus, the sensor substrate 214a supporting the Hall element 230 (detection element) for detecting the electric current of the first plate part 510 is also arranged at the position overlapped with the reactor 80, or close to the reactor 80, as viewed in the front/rear direction of the vehicle 10. Therefore, it becomes possible to suppress interlinkage of the AC magnetic field generated from the reactor 80 with the sensor substrate 214a, and suppress detection errors of the electric current sensors 60a, 60b to a greater extent.

In the embodiment of the present invention, the bus bars 202a, 202b include the third plate part 514 electrically connected to the second plate part 512, and the fourth plate part 516 electrically connecting the third plate part 514 and the switching substrate 300 (FIG. 5). The third plate part 514 and the fourth plate part 516 are arranged between the switching substrate 300 and the first plate part 510, as viewed in the front/rear direction of the vehicle 10 (direction of the coil axes Ax1, Ax2) (FIG. 5, etc.). Further, the third plate part 514 and the fourth plate part 516 are provided between the reactor 80 and the second plate part 512 in the front/rear direction of the vehicle 10 (direction of the coil axes Ax1, Ax2), as viewed in the upper/lower direction of the vehicle 10 (direction perpendicular to the virtual plane P) (FIG. 5, etc.). Further, the third plate part 514 is in parallel to the first plate part 510 and the switching substrate 300 (FIG. 5, etc.), and the fourth plate part 516 is in parallel to the second plate part 512 (FIG. 5, etc.).

As described above, the second plate part 512 and the third plate part 514 are remotely positioned from the reactor 80, in comparison with the fourth plate part 516 in the front/rear direction of the vehicle 10 (direction of the coil axes Ax1, Ax2), as viewed in the upper/lower direction of the vehicle 10 (direction perpendicular to the virtual plane P). Stated otherwise, by combining the first plate part 510, the second plate part 512, the third plate part 514, and the fourth plate part 516, it becomes possible to provide the sensor substrate 214*a* oriented in the front/rear direction of the vehicle 10 (axial direction of the coil axes Ax1, Ax2) at a position shifted from the reactor 80 in the direction of the coil axes Ax1, Ax2, as viewed in the upper/lower direction of the vehicle 10 (direction perpendicular to the virtual plane P). Therefore, it becomes possible to suitably suppress interlinkage of the AC magnetic field generated from the reactor 80 with the sensor substrate 214*a*.

In the embodiment of the present invention, the reactor 80 includes a first coupling coil 102*a* and a second coupling coil 102*b*. The first coupling coil 102*a* includes the first winding part 114*a* and the second winding part 114*b*. The second coupling coil 102*b* includes the third winding part 114*c* and the fourth winding part 114*d* (FIGS. 2 and 3). The first winding part 114*a* and the third winding part 114*c* are aligned with the coil axis Ax1 (winding axis), and the second winding part 114*b* and the fourth winding part 114*d* are aligned with the coil axis Ax2 (winding axis) (FIGS. 2 and 3). Further, the PCU 26 (electric equipment) includes the bus bar 202*a* (first bus bar) and the bus bar 202*b* (second bus bar), the electric current sensor 60*a* (first electric current sensor) for detecting the electric current flowing the first plate part 510 of the bus bar 202*a*, and the electric current sensor 60*b* (second electric current sensor) for detecting the electric current flowing the first plate part 510 of the bus bar 202*b* (FIG. 1). The sensor substrate 214*a* is a common sensor substrate used in common by the electric current sensors 60*a*, 60*b* (FIG. 4, etc.).

Therefore, even in the case where the reactor 80 is a magnetic coupling type reactor, and the bus bars 202*a*, 202*b* are present, it becomes possible to suitably suppress interlinkage of the AC magnetic field generated from the reactor 80 with the sensor substrate 214*a*, and suppress detection errors of the electric current sensors 60*a*, 60*b*. Further, using the common sensor substrate 214*a*, in comparison with the case of providing separate sensor substrates, it becomes possible to reduce the number of component parts, and it becomes easy to position the sensor substrate 214*a*.

B. Modified Embodiments

The present invention is not limited to the above described embodiment. It is a matter of course that various structures can be adopted based on the description of the specification. For example, the following structure can be adopted.

<B-1. Target Applications>

The vehicle 10 according to the above embodiment includes the traction motor 20, the generator 22 (FIG. 1), and the engine (not shown). However, for example, in light of the layout of the electric current sensors 60*a*, 60*b*, the bus bars 202*a*, 202*b*, and the switching substrate 300 relative to the reactor 80, the present invention is not limited in this respect. For example, the vehicle 10 may have structure including a plurality of traction motors 20 and the generators 22.

<B-2. Rotating Electric Machine>

In the embodiment of the present invention, the traction motor 20 and the generator 22 adopt a three-phase AC brushless type (FIG. 1). However, for example, in light of the layout of the electric current sensors 60*a*, 60*b*, the bus bars 202*a*, 202*b*, and the switching substrate 300 relative to the reactor 80, the present invention is not limited in this respect. The traction motor 20 and the generator 22 may adopt a DC type or a brush type.

<B-3. Reactor 80>

In the above embodiment, the reactor 80 is a magnetic coupling type reactor (FIGS. 1 to 3). However, for example, in light of the layout of the electric current sensors 60*a*, 60*b*, the bus bars 202*a*, 202*b*, and the switching substrate 300 relative to the reactor 80, the present invention is not limited in this respect. For example, the reactor 80 may adopt a type including only one coil (normal drive scheme) or may adopt a type including two coils arranged in parallel (interleave scheme), etc.

In the above embodiment, the reactor 80 has been taken as an example of the source of generating the magnetic field. However, the present invention is applicable to other sources of generating the magnetic field as well.

<B-4. Electric Current Sensor 60>

In the above embodiment, the reactor electric current sensors 60*a*, 60*b* have been described (FIGS. 8 to 10, etc.). However, for example, in light of the layout of the electric current sensors relative to the reactor 80, the same structure is applicable to other electric current sensors (e.g., TRC electric current sensor 62).

The sensors 60, 62, 64 of the above embodiment include the Hall elements 230 (Hall IC 210) (FIG. 6). However, for example, in light of the layout of the electric current sensors 60*a*, 60*b*, the bus bars 202*a*, 202*b*, and the switching substrate 300 relative to the reactor 80, the present invention is not limited to these types of the sensors 60, 62, 64. For example, the present invention is applicable to the magnetic sensor other than the Hall element 230 (Hall ICs 210) or other sensors.

In the above embodiment, the sensors 60*a*, 60*b* are arranged in one line in the left/right direction (FIGS. 4, 7 to 9). However, for example, in light of the layout of the electric current sensors relative to the reactor 80, the present invention is not limited in this respect. The sensors 62*u*, 62*v*, 62*w*, 64*u*, 64*v*, 64*w* are not limited in this respect as well.

In the above embodiment, the cores 212 of the sensors 60*a*, 60*b* are oriented in the same direction (FIG. 4, etc.). However, for example, in light of the layout of the electric current sensors relative to the reactor 80, the present invention is not limited in this respect. For example, in the above embodiment, in a plan view, though the gaps 260 are provided on a side of the cores 212 closer to the reactor 80 (FIGS. 7 to 9), the gaps 260 may be provided at other positions. The sensors 62*u*, 62*v*, 62*w*, 64*u*, 64*v*, 64*w* are not limited in this respect as well.

What is claimed is:

1. Electric equipment comprising:
   a reactor including a pair of winding parts, the winding parts including winding axes on a same virtual plane;
   a bus bar electrically connecting the winding parts and a switching element;
   a switching substrate supporting the switching element; and
   an electric current sensor configured to detect electric current flowing the bus bar; and
   a control device configured to control switching of the switching element,
   wherein the electric current sensor includes:
   a detection element;
   an annular core having a gap for providing the detection element; and
   a sensor substrate connecting the detection element and a wiring line, and configured to output a signal indicative of an electric current value, the switching substrate is provided along the winding axes, and a part of the switching substrate is overlapped with the reactor, as viewed in a direction perpendicular to the virtual plane;

the electric current sensor is shifted from the reactor in a direction of the winding axes;

the sensor substrate is provided in parallel to the virtual plane;

the bus bar includes a first plate part and a second plate part;

at least a part of the first plate part is overlapped with the switching substrate as viewed in a direction perpendicular to the virtual plane, and the first plate part extends in parallel to the virtual plane; and the second plate part is provided between the switching substrate and the sensor substrate, and extends from the first plate part toward the switching substrate, as viewed in a direction parallel to the virtual plane.

2. The electric equipment according to claim 1, wherein the detection element is provided between the first plate part and the sensor substrate, as viewed in the direction parallel to the virtual surface and the direction perpendicular to the virtual surface (P), respectively.

3. The electric equipment according to claim 1, wherein the detection element is overlapped with the reactor, as viewed in the direction of the winding axes; and a magnetic field detection surface of the detection element is oriented in a direction perpendicular to the direction of the winding axes.

4. The electric equipment according to claim 1, wherein the first plate part is overlapped with the reactor, as viewed in the direction of the winding axes.

5. The electric equipment according to claim 1, wherein the bus bar comprises:

a third plate part electrically connected to the second plate part; and a fourth plate part electrically connecting the third plate part and the switching substrate, and wherein the third plate part and the fourth plate part are provided between the switching substrate and the first plate part, as viewed in the direction of the winding axes, and the third plate part and the fourth plate part are provided between the reactor and the second plate part in the direction of the winding axes, as viewed in the direction perpendicular to the virtual plane; and the third plate part is in parallel to the first plate part and the switching substrate, and the fourth plate part is in parallel to the second plate part.

6. The electric equipment according to claim 1, wherein the reactor comprises:

a first coupling coil including a first winding part and a second winding part; and a second coupling coil including a third winding part and a fourth winding part, wherein the winding axis of the first winding part is in alignment with the winding axis of the third winding part; and the winding axis of the second winding part is in alignment with the winding axis of the fourth winding part, the electric equipment comprises:

a first bus bar and a second bus bar as a plurality of the bus bars;

a first electric current sensor as the electric current sensor configured to detect electric current flowing the first plate part of the first bus bar; and a second electric current sensor as the electric current sensor configured to detect electric current flowing the first plate part of the second bus bar, and wherein the sensor substrate is a common sensor substrate used in common by the first electric current sensor and the second electric current sensor.

\* \* \* \* \*